United States Patent
Inazuki et al.

(10) Patent No.: US 6,503,668 B2
(45) Date of Patent: Jan. 7, 2003

(54) PHASE SHIFT MASK BLANK, PHASE SHIFT MASK, AND METHOD OF MANUFACTURE

(75) Inventors: Yukio Inazuki, Nakakubiki-gun (JP); Hideo Kaneko, Nakakubiki-gun (JP); Tamotsu Maruyama, Nakakubiki-gun (JP); Satoshi Okazaki, Nakakubiki-gun (JP)

(73) Assignee: Shin-Etsu Chemical Co., Ltd. (JP)

( * ) Notice: Subject to any disclaimer, the term of this patent is extended or adjusted under 35 U.S.C. 154(b) by 61 days.

(21) Appl. No.: 09/757,615

(22) Filed: Jan. 11, 2001

(65) Prior Publication Data
US 2001/0007731 A1 Jul. 12, 2001

(30) Foreign Application Priority Data

Jan. 12, 2000 (JP) .................................... 2000-003344
Oct. 10, 2000 (JP) .................................... 2000-309407

(51) Int. Cl.⁷ ........................... G03F 9/00; B32B 15/04
(52) U.S. Cl. .......................................... 430/5; 428/432
(58) Field of Search ..................... 430/5, 322, 324; 428/432; 427/595; 204/192.12

(56) References Cited

U.S. PATENT DOCUMENTS

| 5,474,864 A | 12/1995 | Isao et al. ................. 430/5 |
| 5,605,776 A | 2/1997 | Isao ............................ 430/5 |
| 5,629,114 A | 5/1997 | Isao et al. ................. 430/5 |
| 5,635,315 A | 6/1997 | Mitsui ........................ 430/5 |
| 5,674,647 A | 10/1997 | Isao et al. ................. 430/5 |
| 5,691,090 A | 11/1997 | Isao et al. ................. 430/5 |
| 5,830,607 A | 11/1998 | Isao et al. ................. 430/5 |
| 5,952,128 A | 9/1999 | Isao ............................ 430/5 |

FOREIGN PATENT DOCUMENTS

JP 7-140635 6/1995

OTHER PUBLICATIONS

Derent WPI abstract of JP 8123010 (May 17, 1996).
Patent Abstracts of Japan JP 04063349 (Feb. 28, 1992).

Primary Examiner—S. Rosasco
(74) Attorney, Agent, or Firm—Millen, White, Zelano & Branigan, P.C.

(57) ABSTRACT

A phase shift mask blank has a phase shift film of MoSiOC or MoSiONC on a transparent substrate, and optionally a chromium-based light-shielding film, a chromium-based antireflection film or a multilayer combination of both on the phase shift film. A manufacture method involving depositing the MoSi base phase shift film by a reactive sputtering technique using a sputtering gas containing carbon dioxide produces a phase shift mask blank and phase shift mask of quality, with advantages of in-plane uniformity and easy control during manufacture.

11 Claims, 5 Drawing Sheets

PHASE SHIFT MASK BLANK, PHASE SHIFT MASK, AND METHOD OF MANUFACTURE

This invention relates to phase shift mask blanks and phase shift masks for use in the fabrication of semiconductor integrated circuits, and more particularly, to phase shift mask blanks and phase shift masks of the halftone type wherein light of exposure wavelength is attenuated by the phase shift film. It also relates to a method of manufacturing such phase shift mask blanks and phase shift masks.

BACKGROUND OF THE INVENTION

Photomasks are used in a wide variety of applications including the fabrication of semiconductor integrated circuits such as ICs, LSIs and VLSIs. Basically, the photomask is prepared from a photomask blank having a chromium based light-shielding film on a transparent substrate, by forming a predetermined pattern in the light-shielding film by photolithography using UV or electron beams. The current demand for a higher level of integration in the semiconductor integrated circuit market has created a need for a smaller pattern rule. The traditional solution is by reducing the wavelength of exposure light.

However, reducing the wavelength of exposure light improves resolution at the sacrifice of focal depth. This lowers the process stability and adversely affects the manufacture yield of products.

One effective pattern transfer method for solving the problem is a phase shift method. A phase shift mask is used as a mask for transferring a micro-pattern.

Figure 9A:
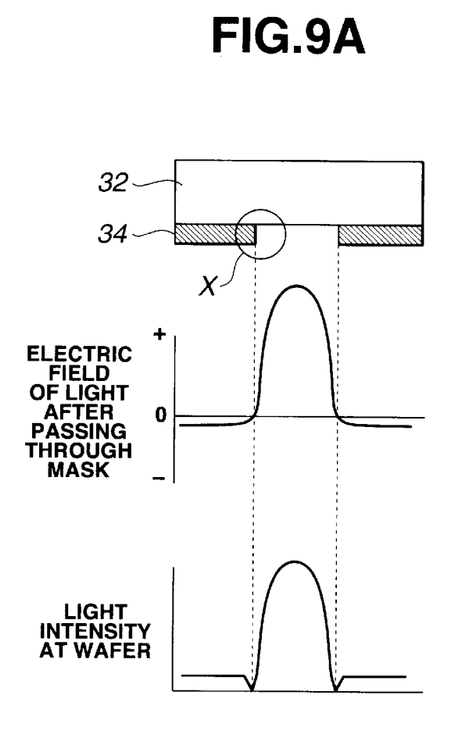
Figure 9B:
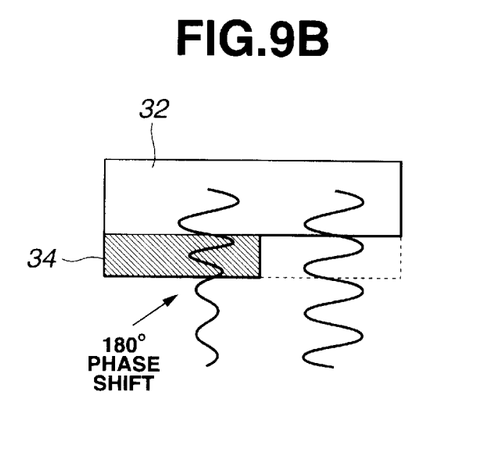
FIG. 9B is an enlarged view of region X in FIG. 9A.

Referring to FIGS. 9A and 9B, a phase shift mask, specifically a halftone phase shift mask is illustrated as comprising a substrate 32 and a phase shifter 34 forming a pattern on the substrate, the substrate 32 being uncovered where the phase shifter 34 is absent. A phase difference of about 180° is set between light transmitted by the uncovered area of substrate 32 and light transmitted by the phase shifter. Due to light interference at the pattern boundary, the light intensity at the interfering boundary becomes zero, improving the contrast of a transferred image. The phase shift method permits to increase the focal depth for acquiring the desired resolution. This achieves improvements in resolution and exposure process margin, as compared with conventional masks having ordinary light-shielding patterns in the form of chromium film.

Depending on the light transmission of phase shifter, the phase shift masks are generally divided for practical application into full transmission type phase shift masks and halftone type phase shift masks. The full transmission type phase shift masks are transparent to the exposure light wavelength because the light transmittance of the phase shifter section is equal to the light transmittance of uncovered substrate areas. In the halftone type phase shift masks, the light transmittance of the phase shifter section is several percents to several tens of percents of the light transmittance of uncovered substrate areas.

Figure 1:
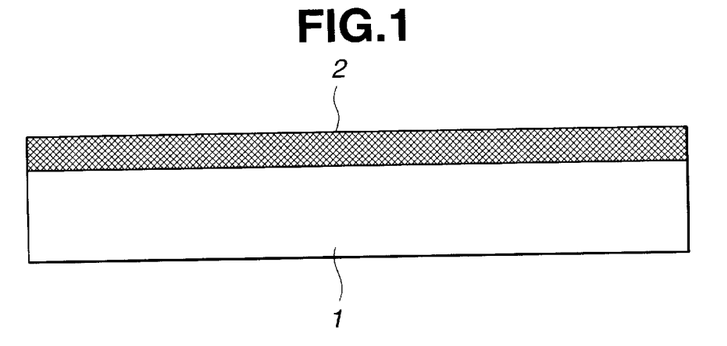
FIG. 1 is a sectional view of a phase shift mask blank according to one embodiment of the invention.
Figure 2:
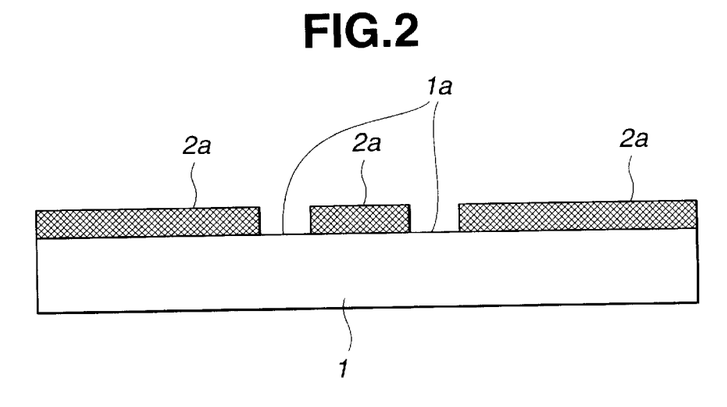
FIG. 2 is a sectional view of a phase shift mask made from the same blank.

FIGS. 1 and 2 illustrate the basic structure of a halftone type phase shift mask blank and a halftone type phase shift mask, respectively. The halftone type phase shift mask blank shown in FIG. 1 has a halftone phase shift film formed over substantially the entire surface of a transparent substrate 1. Patterning the phase shift film 2 results in the halftone type phase shift mask which is shown in FIG. 2 as comprising phase shifter sections 2a forming the pattern on the substrate 1 and uncovered areas 1a of the substrate where the phase shifter is absent. Light that passes the phase shifter section 2a is phase shifted relative to light that passes the uncovered substrate area 1a. The transmittance of the phase shifter section 2a is set to a light intensity that is insensitive to the resist on the transferred substrate. Accordingly, the phase shifter section 2a has a light-shielding function of substantially shielding exposure light.

The halftone type phase shift masks include single-layer halftone type phase shift masks featuring a simple structure and ease of manufacture. Some single-layer halftone type phase shift masks known in the art have a phase shifter of MoSi base materials such as MoSiO and MoSiON as described in JP-A 7-140635.

What is important for such phase shift masks and phase shift mask blanks is the control of optical properties at the exposure wavelength including transmittance, reflectance and refractive index. In particular, optical properties are largely affected by the film composition.

The phase shift masks and phase shift mask blanks having the molybdenum silicide (MoSi) based phase shifter are generally manufactured by a reactive sputtering technique. The reactive gas used for manufacture often contains oxygen gas or nitrogen monoxide gas as an oxygen source. When MoSiO or MoSiON is deposited as the MoSi based phase shift film using such reactive gas, there arises a problem that optical properties including transmittance, reflectance and refractive index often become non-uniform within the plane of the substrate. This phenomenon occurs because the oxidizing gas such as oxygen gas or nitrogen monoxide gas is so reactive that more reaction takes place near the gas inlet port and the quantity of available gas decreases as it flows away from the gas inlet port. Also because of the high reactivity, optical properties rather become sensitive to variations in gas flow rate, which is undesirable for consistent mass manufacture.

SUMMARY OF THE INVENTION

An object of the invention is to provide a phase shift mask blank and a phase shift mask of quality which has fully uniform optical properties within the plane of the substrate. Another object of the invention is to provide a method for manufacturing a phase shift mask blank and a phase shift mask, which is easy to control during deposition of a phase shift film and enables consistent manufacture.

The invention pertains to a phase shift mask blank comprising a substrate transparent to the wavelength of exposure light and at least one layer of phase shift film on the substrate. It has been found that when the phase shift film is formed of molybdenum silicide oxycarbide or molybdenum silicide oxynitride carbide by a sputtering technique using a target of molybdenum silicide and a sputtering gas containing carbon dioxide as an oxygen source and optionally, nitrogen gas as a nitrogen source, the phase shift film has fully uniform optical properties within the substrate plane. The phase shift mask blank is of quality as well as a phase shift mask obtained from the blank. The method is easy to control during deposition of the phase shift film and enables consistent mass manufacture.

In a first aspect, the invention provides a phase shift mask blank comprising a transparent substrate and at least one layer of a phase shift film on the substrate. The phase shift film is formed of molybdenum silicide oxycarbide or molybdenum silicide oxynitride carbide.

In a second aspect, the invention provides a phase shift mask blank comprising a transparent substrate, at least one layer of phase shift film on the substrate, the phase shift film being formed of molybdenum silicide oxycarbide or molybdenum silicide oxynitride carbide, and a chromium-based light-shielding film, a chromium-based antireflection film or a multilayer combination of both on the phase shift film. The chromium-based light-shielding film or antireflection film is preferably formed of chromium oxycarbide or chromium oxynitride carbide.

In either embodiment, the phase shift film shifts the phase of exposure light passing through it by 180±5 degrees and has a transmittance of 3 to 40%.

In a third aspect, the invention provides a phase shift mask manufactured by patterning the phase shift film on the phase shift mask blank.

In a fourth aspect, the invention provides a method of manufacturing a phase shift mask blank comprising a transparent substrate and at least one layer of phase shift film on the substrate, the method comprising the step of forming the phase shift film by a sputtering technique using a target of molybdenum silicide and a sputtering gas containing carbon dioxide as an oxygen source and optionally, nitrogen gas as a nitrogen source. Preferably, the phase shift film shifts the phase of exposure light passing through it by 180±5 degrees and has a transmittance of 3 to 40%.

The method may further include the step of forming a chromium-based light-shielding film, a chromium-based antireflection film or a multilayer combination of both on the phase shift film by a sputtering technique using a target of chromium alone or in admixture with at least one of oxygen, nitrogen and carbon.

In a further aspect, the invention provides a method of manufacturing a phase shift mask, comprising the steps of lithographically forming a patterned resist film on the phase shift film of the phase shift mask blank obtained by the method of the fourth aspect; removing areas of the phase shift film which are not covered with the resist film, by an etching technique; and removing the resist film.

In a still further aspect, the invention provides a method of manufacturing a phase shift mask, comprising the steps of etching away areas of the chromium-based light-shielding or antireflection film or multilayer combination obtained by the above method where exposure to light is necessary, so as to leave corresponding areas of the phase shift film exposed on the surface; lithographically forming a patterned resist film on the phase shift film; removing areas of the phase shift film which are not covered with the resist film, by an etching technique; and removing the resist film.

When an oxidized film of molybdenum silicide is deposited on a substrate by a reactive sputtering technique, the invention uses carbon dioxide gas, which is less reactive than oxygen and nitrogen monoxide gas, as the oxidizing gas. Because of the low reactivity, the carbon dioxide gas can spread around uniformly over a wider extent so that the MoSi base phase shift film deposited has uniform optical properties within the substrate plane.

Also because of the low reactivity, the carbon dioxide gas allows for a greater margin against unexpected variations of many parameters associated with the deposition process. Then the MoSi base phase shift film can be deposited in a stable and controllable manner.

In the embodiment wherein a phase shift film is formed of molybdenum silicide oxycarbide or molybdenum silicide oxynitride carbide and a chromium-based light-shielding film, a chromium-based antireflection film or a multilayer combination of both is formed on the phase shift film, they cooperate to allow for precise patterning to a finer rule. The phase shift mask lends itself to the fabrication of semiconductor integrated circuits to a smaller minimum feature size and a higher level of integration.

BRIEF DESCRIPTION OF THE DRAWINGS

The above and other objects, features and advantages of the invention will become more apparent from the following detailed description, taken in conjunction with the accompanying drawings.

FIG. 6 illustrates in sectional view the method of manufacturing phase shift masks according to the invention.

FIGS. 9A and 9B illustrate the operating principle of a halftone phase shift mask.

DESCRIPTION OF THE PREFERRED EMBODIMENT

As shown in FIG. 1, the phase shift mask blank of the invention comprises a substrate 1 which is made of a material such as quartz or $CaF_2$ that is transparent to the exposure light and a phase shift film 2 of molybdenum silicide oxycarbide (MoSiOC) or molybdenum silicide oxynitride carbide (MoSiONC) formed on the substrate. The phase shift mask of the invention is manufactured by patterning the phase shift film 2 on the phase shift mask blank. Referring to FIG. 2, the phase shift mask has a first light-transmitting region (or uncovered substrate region) 1a between two patterned phase shifter sections, and each phase shifter section forms a second light-transmitting region 2a.

More particularly, the phase shift mask blank has on a transparent substrate at least one layer of phase shift film of a MoSi base material, typically molybdenum silicide oxycarbide (MoSiOC) or molybdenum silicide oxynitride carbide (MoSiONC) which is deposited by a reactive sputtering technique using a sputtering gas containing carbon dioxide as an oxygen source so that the phase shift film has a transmittance of several percents to several tens of percents, especially 3 to 40%, of the exposure light and provides a phase difference of 180±5° between light that passes the phase shifter section and light that passes only the transparent substrate.

The preferred method of forming the phase shift film is a reactive sputtering technique. The target used herein for sputtering is molybdenum silicide. Molybdenum silicide having added thereto at least one of oxygen, nitrogen, carbon or mixtures of any may be used, if necessary or adequate to maintain the composition of film unchanged.

The sputtering technique may employ either a direct-current power supply (d.c. sputtering) or a high-frequency power supply (RF sputtering). The use of magnetron sputtering or conventional sputtering is also possible. The deposition system may be either a continuous, in-line system or a single-workpiece processing system.

The sputtering gas has a composition comprising an inert gas such as argon or xenon and carbon dioxide gas. Any of gases of nitrogen, oxygen, nitrogen oxides, carbon oxides, and other useful compounds may be added to the sputtering gas so that the phase shift film deposited may have the desired composition.

When it is desired to increase the transmittance of a phase shift film deposited, for example, the amount of oxygen or nitrogen-containing gas to be added to the sputtering gas is increased so that more oxygen or nitrogen is incorporated in the film. Alternatively, molybdenum silicide having more oxygen or nitrogen previously added thereto is used as the sputtering target.

More particularly, when molybdenum silicide oxycarbide (MoSiOC) is to be deposited, reactive sputtering is preferably effected using molybdenum silicide as the target and a mixture of argon gas and carbon dioxide gas as the sputtering gas. When molybdenum silicide oxynitride carbide (MoSiONC) is to be deposited, the preferred reactive sputtering technique uses molybdenum silicide as the target and a mixture of argon gas, carbon dioxide gas and nitrogen gas as the sputtering gas.

The MoSiOC film deposited preferably has a composition consisting essentially of 5 to 25 at % of Mo, 10 to 35 at % of Si, 30 to 60 at % of O, and 3 to 20 at % of C. The MoSiONC film deposited preferably has a composition consisting essentially of 5 to 25 at % of Mo, 10 to 35 at % of Si, 30 to 60 at % of O, 5 to 30 at % of N, and 3 to 20 at % of C.

By virtue of carbon dioxide gas used as the oxygen source, the phase shift mask blank has such uniform optical properties that when a reflectance at a wavelength of 450 nm is measured, the standard deviation of reflectance within the substrate plane is up to 0.5%, preferably up to 0.1%.

In the phase shift mask blank, the phase shift film can be formed as two or more layers.

Figure 3:
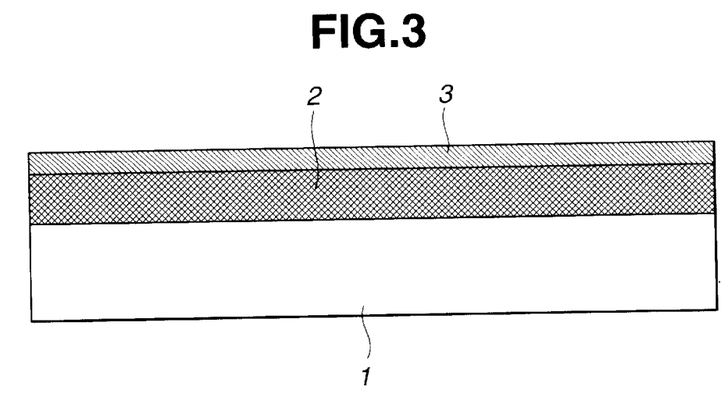
FIG. 3 is a sectional view of a phase shift mask blank provided with a chromium-based light-shielding film according to another embodiment of the invention.
Figure 4:
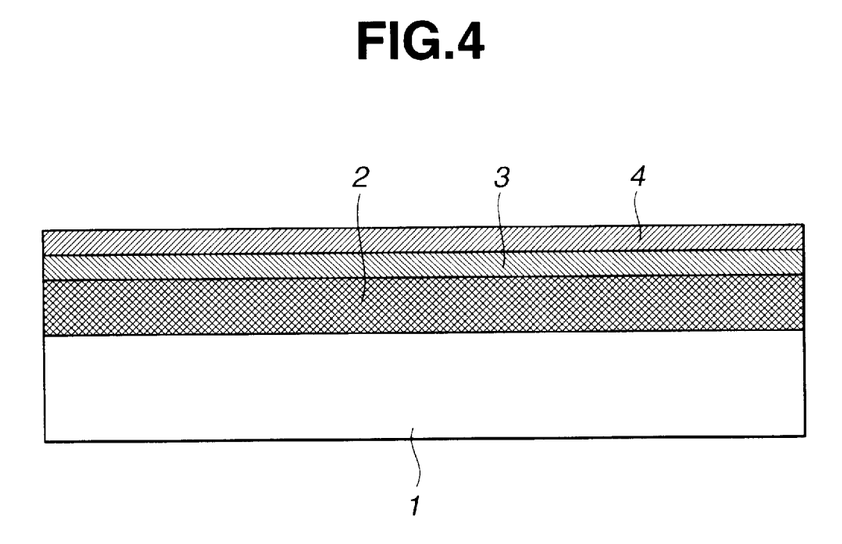
FIG. 4 is a sectional view of a phase shift mask blank provided with a chromium-based light-shielding film and a chromium-based antireflection film according to yet another embodiment of the invention.
Figure 5:
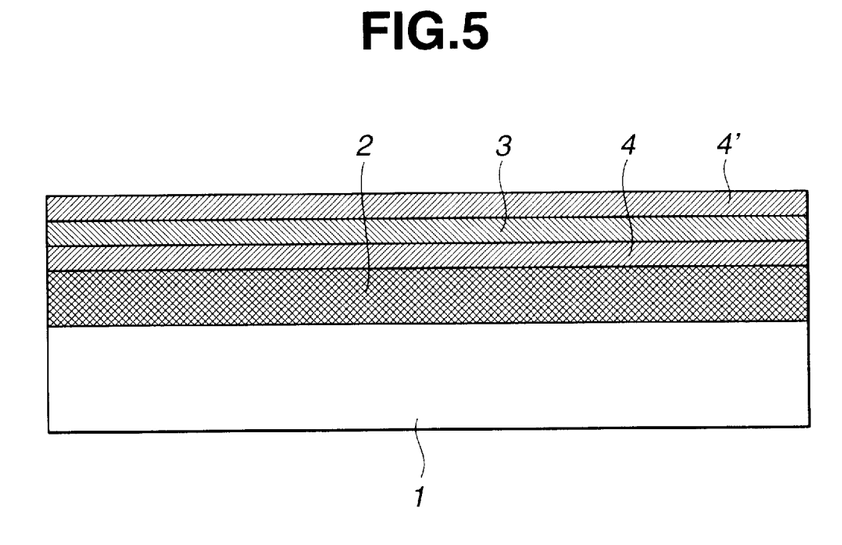
FIG. 5 is a sectional view of a phase-shift mask blank according to a further embodiment of the invention.
Figure 6A:
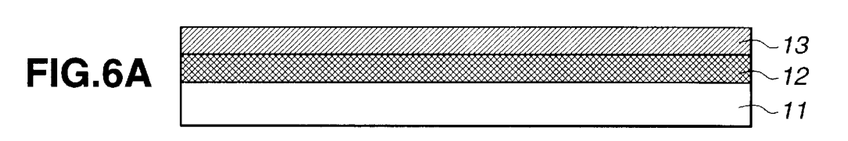
FIG. 6A shows the mask blank on which a resist film has been formed.
Figure 6B:
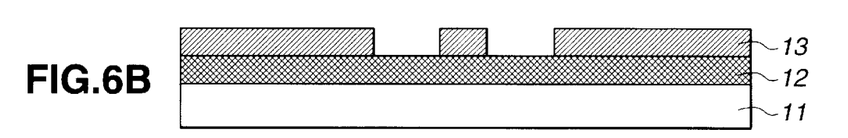
FIG. 6B shows the structure after the resist film has been patterned.
Figure 6C:
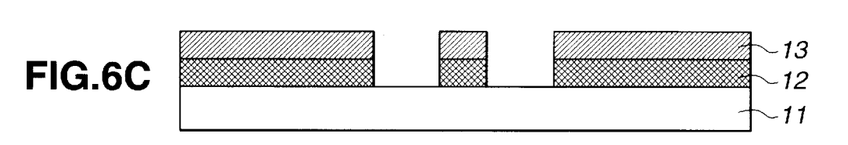
FIG. 6C shows the structure after etching.
Figure 6D:
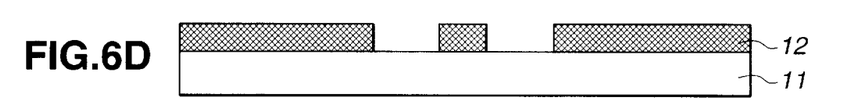
FIG. 6D shows the structure after the resist film has been removed.

In one preferred embodiment of the invention, as shown in FIG. 3, the phase shift mask blank further includes a chromium-based light-shielding film 3 on the phase shift film 2 of molybdenum silicide oxycarbide or molybdenum silicide oxynitride carbide. In a further preferred embodiment, as shown in FIG. 4, the phase shift mask blank further includes a chromium-based antireflection film 4 formed on the chromium-based light-shielding film 3 for reducing reflection from the light-shielding film 3. In a still further preferred embodiment, as shown in FIG. 5, the phase shift mask blank includes a phase shift film 2, a first chromium-based antireflection film 4, a chromium-based light-shielding film 3, and a second chromium-based antireflection film 4' formed on a substrate 1 in the described order.

The chromium-based light-shielding film or chromium-based antireflection film is preferably made of chromium oxycarbide (CrOC), chromium oxynitride carbide (CrONC) or a multilayer combination of both.

The chromium-based light-shielding film or chromium-based antireflection film can be formed by reactive sputtering in which the target is chromium by itself or chromium having added thereto oxygen, nitrogen, carbon or a combination thereof; and the sputtering gas is an inert gas such as argon or krypton to which carbon dioxide gas is added as a carbon source.

For example, sputtering gases which may be used to form a CrONC film include a mixed gas composed of at least one each of a carbon-containing gas (e.g., $CH_4$, $CO_2$, CO), a nitrogen-containing gas (e.g., NO, $NO_2$, $N_2$) and an oxygen-containing gas (e.g., $CO_2$, NO, $O_2$), or any such gas mixture in combination with an inert gas such as argon, neon or krypton. Using $CO_2$ gas as both the carbon source and the oxygen source is especially advantageous for uniformity in the plane of the substrate and for controllability during production. Each of the sputtering gases may be separately introduced into the sputtering chamber, or some or all of the gases may first be mixed together then introduced into the chamber.

In the CrOC film, the Cr content is preferably 20 to 95 atomic %, especially 30 to 85 atomic %, and the C content is preferably 1 to 30 atomic %, especially 5 to 20 atomic %, and the O content is preferably 1 to 60 atomic %, especially 5 to 50 atomic %. In the CrONC film, the Cr content is preferably 20 to 95 atomic %, especially 30 to 80 atomic %, and the C content is preferably 1 to 20 atomic %, especially 2 to 15 atomic %, and the O content is preferably 1 to 60 atomic %, especially 5 to 50 atomic %, and the N content is preferably 1 to 30 atomic %, especially 3 to 20 atomic %.

The phase shift mask of the invention is manufactured by patterning the phase shift film on the phase shift mask blank produced as described above.

More specifically, the phase shift mask of the structure shown in FIG. 2 may be manufactured by a process as shown in FIG. 6. After a molybdenum silicide oxycarbide or molybdenum silicide oxynitride carbide layer 12 is formed on a substrate 11, a resist film 13 is formed on the layer 12 (FIG. 6A). The resist film 13 is lithographically patterned (FIG. 6B), after which the molybdenum silicide oxycarbide or molybdenum silicide oxynitride carbide layer 12 is etched (FIG. 6C), and the resist film 13 is subsequently stripped (FIG. 6D). In this process, application of the resist film, patterning (exposure and development), etching, and removal of the resist film may be carried out by known methods.

Figure 7:
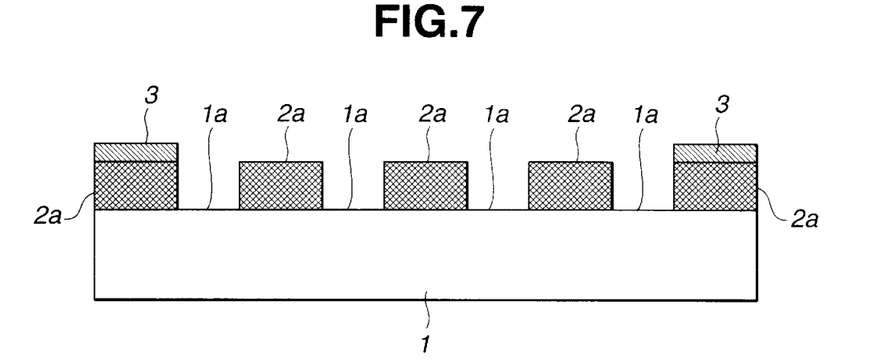
FIG. 7 is a sectional view showing another embodiment of a phase shift mask according to the invention.

In cases where a Cr-based film (e.g., chromium-based light-shielding film and/or chromium-based antireflection film) is formed on the MoSi-based phase shift film, a phase shift mask on which the Cr-based film 3 remains at the peripheral edges of the substrate 1 (see FIG. 7) can be produced by etching away the Cr-based film 3 in the regions that must be exposed to light, thereby leaving the surface of the phase shift film 2 exposed, then patterning the phase shift film 2 into sections 2a as described above. Alternatively, a phase shift mask can be produced by applying a resist to the Cr-based film 3 and patterning the resist, then etching the Cr-based film 3 and the phase shift film 2 for patterning. Only the regions of the Cr-based film 3 which must be exposed to light are then removed by selective etching so as to leave the phase shift pattern exposed at the surface.

EXAMPLES

The following examples are provided by way of illustration, and are not intended to limit the scope of the invention.

Example 1

Figure 8:
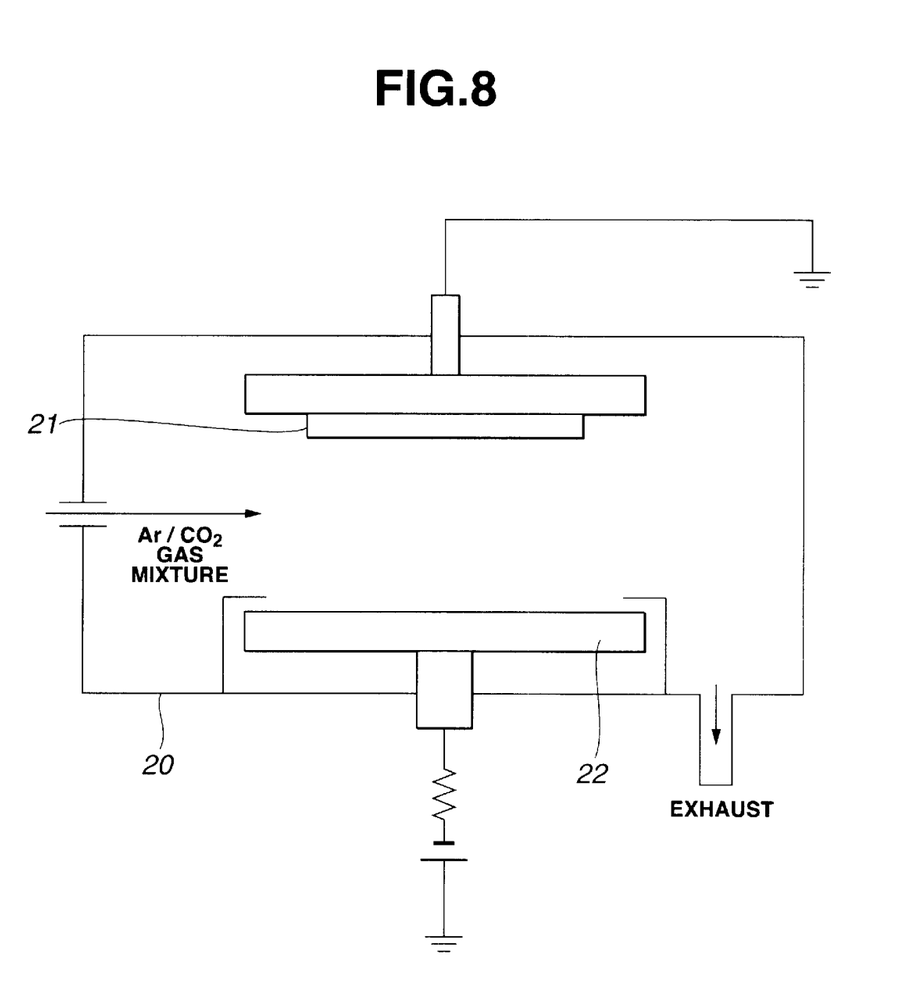
FIG. 8 is a schematic view of the d.c. sputtering system used in Examples.

A molybdenum silicide oxycarbide (MoSiOC) film was formed on a quartz substrate in the d.c. sputtering system shown in FIG. 8. The system had a d.c. sputtering chamber 20 containing a quartz substrate 21 and a target 22. Using molybdenum silicide as the target and a mixture of argon gas and carbon dioxide gas in a flow ratio of about 7:8 as the sputtering gas, reactive sputtering was carried out. A shower of the gas mixture was passed through the chamber in the manner shown in FIG. 8. During the sputtering, the gas pressure was set at 0.3 Pa.

As typical optical properties of the sample, a reflectance at a wavelength of 450 nm was measured by means of NANOSPEC by NANOMETRICS Co., finding an average reflectance within the substrate plane of 9.4% with a standard deviation of 0.01%. The film composition of this sample was analyzed by x-ray photoelectron spectroscopy (XPS), finding that it contained 11.4 at % of molybdenum, 25.3 at % of silicon, 51.6 at % of oxygen, and 11.6 at % of carbon. The results are shown in Table 1.

Example 2

By using the same sputtering system as in Example 1 and sputtering under the same conditions as in Example 1 except that a mixture of argon gas, carbon dioxide gas and nitrogen gas in a flow ratio of 5:3:3 was used as the sputtering gas, a molybdenum silicide oxynitride carbide (MoSiONC) film was formed on a quartz substrate to a thickness of 140 nm.

As typical optical properties of the sample, a reflectance at a wavelength of 450 nm was measured, finding an average reflectance within the substrate plane of 7.8% with a standard deviation of 0.02%. The sample had a phase difference of 182° and a transmittance of 8.3% at a wavelength of 248 nm. The film composition of this sample was analyzed by XPS, finding that it contained 14.0 at % of molybdenum, 23.0 at % of silicon, 46.0 at % of oxygen, 9.0 at % of nitrogen, and 8.0 at % of carbon. The results are shown in Table 1.

Example 3

A CrOCN film was formed on the phase shift film obtained in Example 2 to a thickness of 100 nm by using the same sputtering system as in Example 1 and sputtering a target of chromium with a sputtering gas in the form of a mixture of argon gas, carbon dioxide gas and nitrogen gas in a flow ratio of 7:4:3.

The CrOCN film had a reflectance of 30% at 450 nm with an in-plane variance D of 0.019%. The variance D is computed according to the following equation:

$$D=(max-min)/(max+min)$$

wherein "max" is a maximum reflectance in plane and "min" is a minimum reflectance in plane.

The CrOCN film had a composition consisting of 51 at % of chromium, 6 at % of carbon, 20 at % of oxygen, and 23 at % of nitrogen.

Comparative Example 1

A MoSiO film was formed by the same procedure as in Example 1 except that oxygen gas was used instead of the carbon dioxide gas. A reflectance at a wavelength of 450 nm was similarly measured, finding an average reflectance within the substrate plane of 27.0% with a standard deviation of 0.95%. The film composition of this sample was similarly analyzed, finding that it contained 25.2 at % of molybdenum, 38.0 at % of silicon, and 36.8 at % of oxygen. Carbon was below the measurement limit. The results are also shown in Table 1.

TABLE 1

| | Reflectance at 450 nm | | Film composition (at %) | | | | |
|---|---|---|---|---|---|---|---|
| | Average | SD | Mo | Si | O | N | C |
| E1 | 9.4% | 0.01% | 11.4 | 25.3 | 51.6 | — | 11.6 |
| E2 | 7.8% | 0.02% | 14.0 | 23.0 | 46.0 | 9.0 | 8.0 |
| CE1 | 27.0% | 0.95% | 25.2 | 38.0 | 36.8 | — | — |

A comparison of Examples 1 and 2 with Comparative Example 1 in Table 1 reveals that when carbon dioxide gas was used as the oxygen source, the standard deviation of reflectance within the substrate plane of the molybdenum silicide oxycarbide film or molybdenum silicide oxynitride carbide film was improved by approximately two orders of magnitude. The use of carbon dioxide gas as the oxygen source also led to a decline of reflectance because oxygen was effectively incorporated in the film so that the transmittance was increased, and as a consequence, the reflectance was decreased.

With respect to the film composition, since carbon dioxide gas was included in the sputtering gas, there was formed a molybdenum silicide oxycarbide or molybdenum silicide oxynitride carbide film which contained about 10 atom percents of carbon in addition to molybdenum, silicon, oxygen and nitrogen.

With respect to the stability of deposition process, as compared with the use of oxygen gas, the use of carbon dioxide gas provided a greater margin for many parameters of the deposition process against variations. Films could be deposited in a reproducible manner.

There have been described a phase shift mask blank and a phase shift mask in which a MoSi based phase shift film is deposited by reactive sputtering using a gas mixture containing carbon dioxide as the sputtering gas, whereby a phase shift film of molybdenum silicide oxycarbide or molybdenum silicide oxynitride carbide is provided. The phase shift mask blank and phase shift mask are of quality in that they have the advantages of high uniformity in plane and good controllability during manufacture.

Japanese Patent Application Nos. 2000-003344 and 2000-309407 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A phase shift mask blank comprising a transparent substrate and at least one layer of phase shift film on the substrate, wherein the phase shift film is formed of molybdenum silicide oxycarbide or molybdenum silicide oxynitride carbide.

2. A phase shift mask blank comprising a transparent substrate, at least one layer of phase shift film on the substrate, the phase shift film being formed of molybdenum silicide oxycarbide or molybdenum silicide oxynitride carbide, and a chromium-based light-shielding film, a chromium-based antireflection film or a multilayer combination of both on the phase shift film.

3. The phase shift mask blank of claim 2, wherein the chromium-based light-shielding film or antireflection film is formed of chromium oxycarbide or chromium oxynitride carbide.

4. The phase shift mask blank of claim 1 or 2, wherein the phase shift film shifts the phase of exposure light passing through it by 180±5 degrees and has a transmittance of 3 to 40%.

5. A phase shift mask manufactured by patterning the phase shift film on the phase shift mask blank of claim 1 or 2.

6. A method of manufacturing a phase shift mask blank comprising a transparent substrate and at least one layer of phase shift film on the substrate, said method comprising the step of:

forming the phase shift film by a sputtering technique using a target of molybdenum silicide and a sputtering gas containing carbon dioxide as an oxygen source.

7. A method of manufacturing a phase shift mask blank comprising a transparent substrate and at least one layer of phase shift film on the substrate, said method comprising the step of:

forming the phase shift film by a sputtering technique using a target of molybdenum silicide and a sputtering gas containing carbon dioxide as an oxygen source and nitrogen gas as a nitrogen source.

8. The method of claim 6 or 7, further comprising the step of forming a chromium-based light-shielding film, a chromium-based antireflection film or a multilayer combination of both on the phase shift film by a sputtering technique using a target of chromium alone or in admixture with at least one of oxygen, nitrogen and carbon.

9. A method of manufacturing a phase shift mask, comprising the steps of:

etching away areas of the chromium-based light-shielding or antireflection film or multilayer combination obtained by the method of claim 8 where exposure to light is necessary, so as to leave corresponding areas of the phase shift film exposed on the surface, lithographically forming a patterned resist film on the phase shift film, removing areas of the phase shift film which are not covered with the resist film, by an etching technique, and removing the resist film.

10. The method of claim 6 or 7, wherein the phase shift film shifts the phase of exposure light passing through it by 180±5 degrees and has a transmittance of 3 to 40%.

11. A method of manufacturing a phase shift mask, comprising the steps of:

lithographically forming a patterned resist film on the phase shift film of the phase shift mask blank obtained by the method of claim 6 or 7, removing areas of the phase shift film which are not covered with the resist film, by an etching technique, and removing the resist film.

* * * * *